United States Patent [19]
Sone et al.

[11] 4,403,247
[45] Sep. 6, 1983

[54] SOLID STATE COLOR IMAGING APPARATUS

[75] Inventors: Yoshiaki Sone, Toyonaka; Susumu Hashimoto, Moriyama; Kiyotsugu Ishikawa, Takatsuki; Takao Kunii, Amagasaki, all of Japan

[73] Assignee: Matsushita Electronics Corporation, Kadoma, Japan

[21] Appl. No.: 235,428

[22] Filed: Feb. 17, 1981

[30] Foreign Application Priority Data

Feb. 18, 1980 [JP] Japan ................................. 55-19497

[51] Int. Cl.³ ............................................. H04N 9/07
[52] U.S. Cl. ..................................................... 358/44
[58] Field of Search ..................................... 358/44, 47

[56] References Cited
U.S. PATENT DOCUMENTS 3,971,065  7/1976  Bayer ...................................... 358/44
4,282,547  8/1981  Morishita .............................. 358/44

FOREIGN PATENT DOCUMENTS 2033189  5/1980  United Kingdom .................. 358/44

Primary Examiner—John C. Martin
Attorney, Agent, or Firm—Cushman, Darby & Cushman

[57] ABSTRACT

In a solid state color imaging apparatus comprising
  a solid state photoelectric device having an array of picture elements,
  a color filter fixed in front of the solid state photoelectric device,
  the improvement is that
  the color filter has filter elements of a first complementary color (cy), and filter elements of a second complementary color (ye) and substantially transparent parts (tr).
The apparatus has, by use of complementary color filter elements, a high light utility efficiency which is about 9 dB higher efficiency than the conventional color filter consisting of primary color filter elements, and hence has a higher S/N ratio.

11 Claims, 20 Drawing Figures

| tr | ye | tr | ye | ← 21 |
| cy | tr | cy | tr | ← 22 |
| tr | ye | tr | ye | ← 23 |
| cy | tr | cy | tr | ← 24 |

| tr | tr | tr | tr | ← 41 |
| ye | cy | ye | cy | ← 42 |
| tr | tr | tr | tr | ← 43 |
| ye | cy | ye | cy | ← 44 |

| tr | cy | tr | cy | N-th line |
| tr | cy | tr | cy | N'-th line |
| ye | tr | ye | tr | (N+1)-th line |
| ye | tr | ye | tr | (N+1)'-th line |

| position<br>color bar | 1 | 2 | 3 | 4 |
|---|---|---|---|---|
| yellow | 0° | 0° | +1.5° | -3° |
| cyanic | 0° | 0° | 0° | 0° |
| green | 0° | 0° | +1° | +2° |
| magenta | 0° | -1° | -2° | -3° |
| red | 0° | -1° | -2.5° | -3° |
| blue | 0° | +0.5° | +1° | +2° |

FIG.12 (b)

SOLID STATE COLOR IMAGING APPARATUS

BACKGROUND OF THE INVENTION

1. Field of the Invention

The present invention relates to an improvement of a solid state color image pick-up apparatus provided with minute color filters in front of the light receiving face thereof to pick-up color images.

2. Description of Prior Arts

Solid-state pick-up device made as a CCD, BBD, MOS device or hybrid devices thereof, which has a novel characteristic which is not possessed by the conventional picture pick-up tubes is making rapid development. The solid state apparatus, on top of smallness and light weight, low power consumption, high reliability and long life, has advantages of having no burning by image on photoelectric face and no distortion of image pattern. Accordingly, the device recently comes into wide uses in remote monitoring, application in a distance measuring, or in color television cameras using three chips, two chips of single chip. Besides, the solid state apparatus does not make distortion of pattern due to environmental magnetic field and electric field, and hence is possible to make precise measurement of position and length. In making a two-chip or single chip type color image pick-up camera, filter is bonded in front of the chip to produce separate color signals thereby; in such case, the positions of the respective colors of filter are obtained by electric means, since there is no pattern distortion like the case of conventional pick-up tube utilizing electromagnetic deflections; and therefore, the separation of color signal is possible without a particular index signal or a particular processing of signal.

Figure 1:
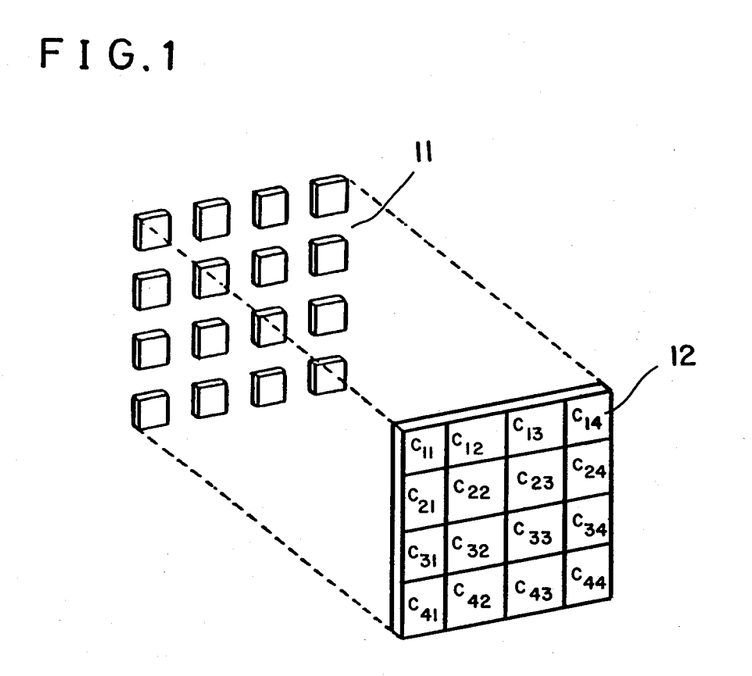
FIG. 1 is a schematical perspective view showing a relation between filter elements and the picture element of a solid state color imaging apparatus.

It is known that, in order to make a color image pick-up camera with a single chip, an array 12 of filter having an array of colors to correspond to picture element 11 of a solid state device is bonded in front of the solid state device, as shown in FIG. 1, which schematically shows only a small fraction of the picture elements and corresponding filters, wherein $C_{11}$, $C_{12}$, $C_{13}$, ... $C_{44}$ ... designate element color filters of the filter 12. A color image pick-up camera is constituted in a manner that signals of the above-mentioned solid state device are then sampled or detected thereby to separate luminance signal component and chrominance signal component therefrom.

In the conventional color image pick-up camera of the abovementioned constitution, the element color filters $C_{11}$, $C_{12}$, $C_{13}$, ... $C_{44}$ ... have been constituted principally with primary colors, for example, red, blue and green, and therefore efficiency of light utility has been poor. That is, for example, green filter element substantially cut off other component of light, namely red component and blue component.

In another conventional color image pick-up device disclosed in the U.S. Pat. No. 3,971,065, there is disclosed that, besides chrominance element filters of red color and blue color, a further filter to produce a luminance signal is made by green element filters, but this art only discloses use of primary color filter elements whereby high efficiency of light utility is impossible.

SUMMARY OF THE INVENTION

The present invention purposes to provide an improved solid state color imaging apparatus wherein light utility is efficient and processing of image signal is simple.

The present invention can easily eliminate line crowling, which is ununiformity of luminance signal component among horizontal scanning lines.

DESCRIPTION OF THE PREFERRED EMBODIMENTS

A solid state color imaging apparatus in accordance with the present invention comprises a solid state photoelectric device having an array of picture elements, a color filter fixed in front of the solid-state photoelectric device, wherein the improvement is that the color filter has filter elements of a first complementary color (e.g. cyanic), filter elements of a second complementary color (e.g. yellow) and substantially transparent parts.

In the present invention, in accordance with the ordinary use of the technical terms in the field of color television technology, the words "primary colors" are used to mean the primary colors of light, namely red, blue and green; and the words "complementary colors" are used to mean the complementry colors against the abovementioned primary colors of light; that is, the "complementary colors" implies:

cyanic—against the primary color red,
yellow—against the primary color blue, and
magenta—against the primary color green.

Therefore, it is to be noted that, in the present invention, the words "complementary colors" imply the abovementioned particular complementary colors instead of general contents of the same words. In the present invention, R, B, G, cy and ye imply red, blue, green, cyanic and yellow, respectively.

Figure 2A:
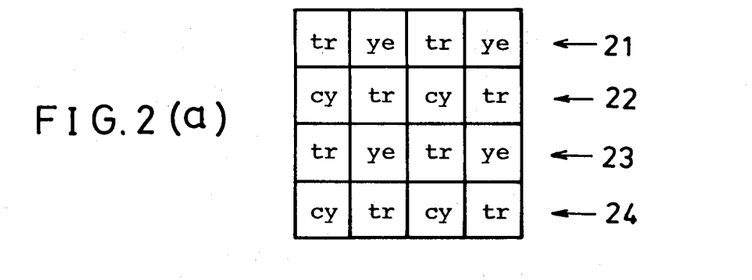
FIG. 2(a) is a schematical front view of a small part of an example of filter of a solid state color imaging apparatus in accordance with the present invention.
Figure 2B:
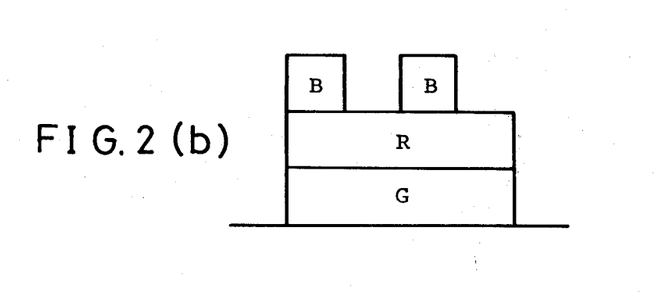
FIG. 2(b) and FIG. 2(c) are chart schematically showing intensity of primary color components of light obtained by the filter of FIG. 2(a).
Figure 2C:
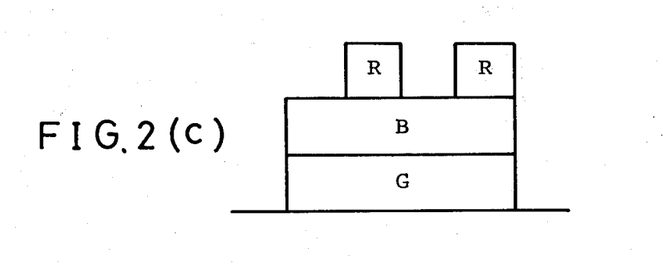

FIG. 2(a) schematically shows a small part of one example of disposition of filter elements of the present invention. In the array the odd number lines 21 and 23 consist of yellow filter elements and transparent parts, and the even number lines 22 and 24 consist of cyanic filter elements and transparent parts, and the odd number lines and the even number lines are disposed in a manner that transparent parts lie under the complementary color element parts. That is, the transparent parts are disposed in staggered array. FIG. 2(b) and FIG. 2(c) respectively shown positional distribution of component primary colors of light contained in the incident light on the photoelectric elements passing through the yellow & transparent lines 21, 23 and those through the cyanic & transparent lines 22, 24. That is to say, the yellow filter elements in the lines 21 and 23 cut out only the blue color light and pass red and green color lights, and the cyanic filter elements in the lines 22 and 24 cut out only the red color light and pass blue and green color lights. In the conventional filter array using the filter elements of three primary colors of light, i.e., red, blue and green colors, such as disclosed in the aforementioned U.S. Pat. No. 3,971,065 for Bayer, the light passing through the primary color filter elements has been very narrowly limited of its spectral distribution thereby losing considerable parts of the incident light. In contradistinction to such conventional art, the filter in accordance with the present invention uses complementary color filters, which passes wide spectral range of light, and accordingly, the light utility efficiency is much improved in comparison with the conventional art.

Figure 3:
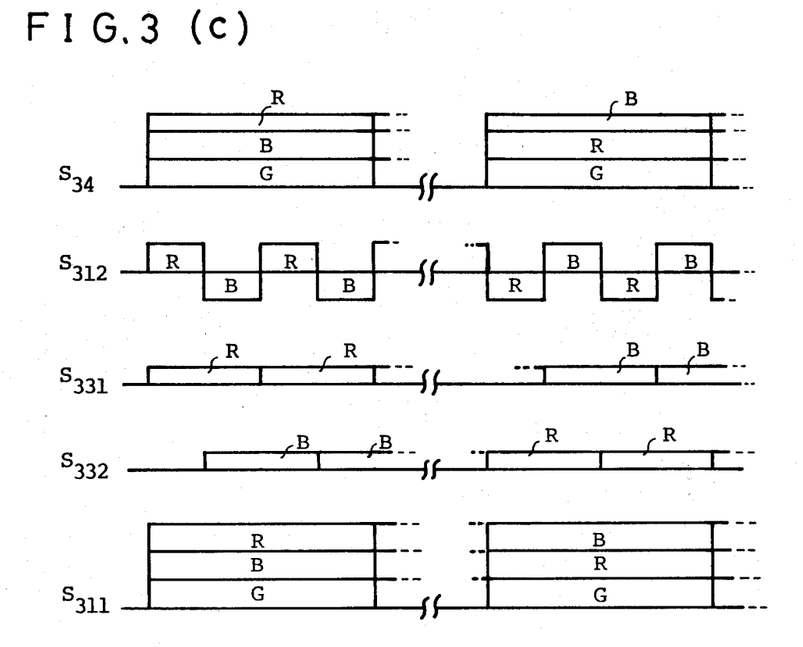
FIG. 3(a) is a block diagram of a first example (sampling type) of signal processing circuit for processing signals issued from the photoelectric device of FIG. 2(a).
FIG. 3(b) is a block diagram of a second example (frequency separation type) of signal processing circuit for processing signals issued from the photoelectric device of FIG. 2(a).
FIG. 3(c) is a chart showing processing of color signal by the circuit of FIG. 3(a).
FIG. 3(d) is a chart showing processing of color signal by the circuit of FIG. 3(b).
Figure 3A:
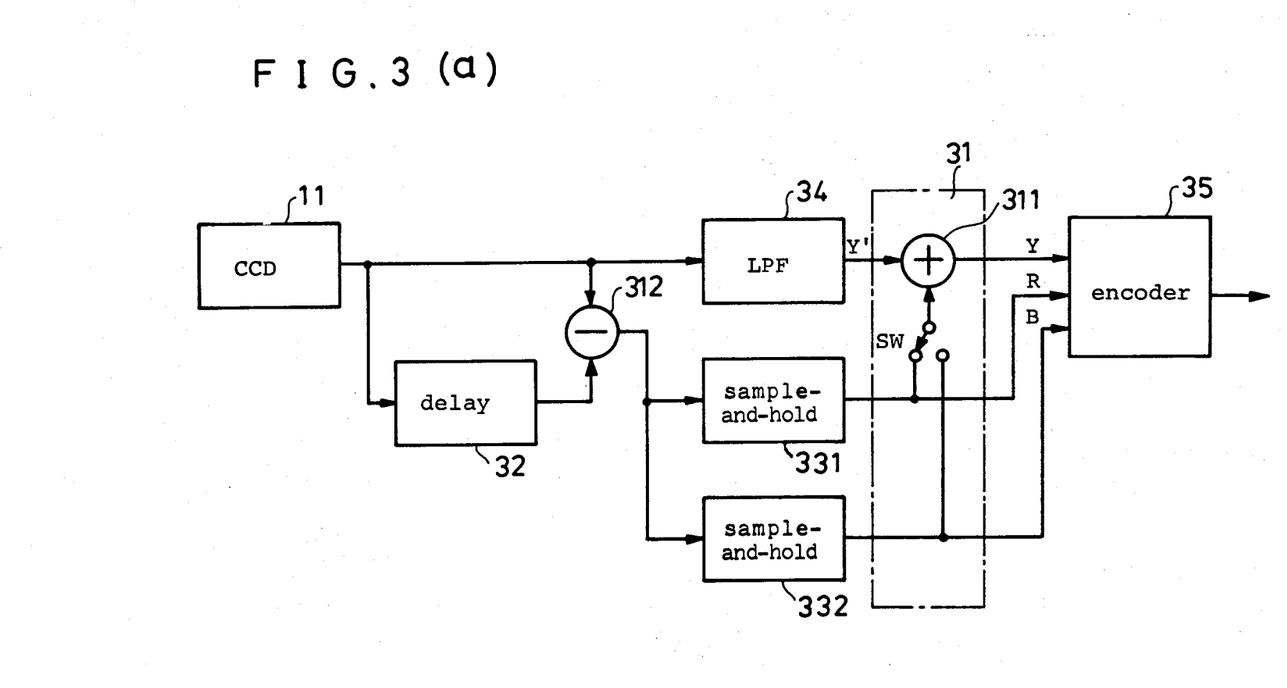
Figure 3B:
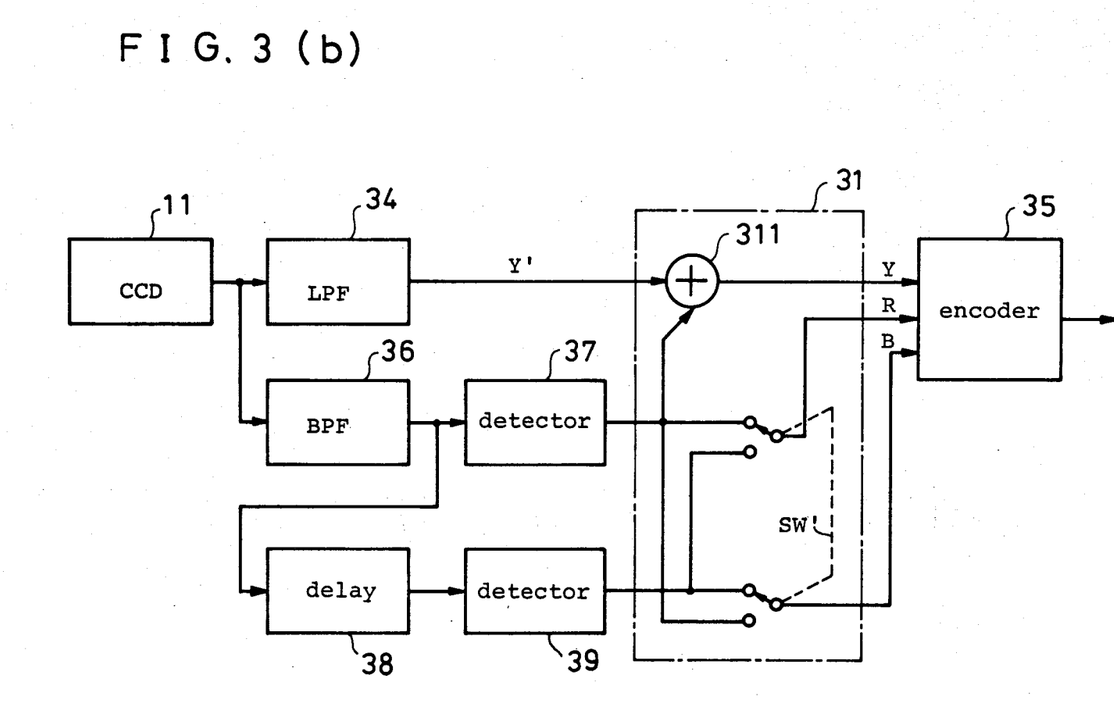

FIG. 3(a) and FIG. 3(b) show examples of the electric circuit construction to process the color light signal obtained from the solid state color imaging apparatus in accordance with the present invention, wherein the circuit of FIG. 3(a) is a circuit of sampling type and that of FIG. 3(b) is a frequency separation type.

In the circuit of FIG. 3(a), the output of the solid state photoelectric device 11, which is a CCD or BBD, is led through a low pass filter 34 of cut off frequency of 3.58 MHz to an adding point 311, and also led to a subtracting point 312 through a delay circuit 32 which delays the signal for a time period of one horizontal scanning. By subtracting the delayed signal from the original signal, an R-B alternating signal showing by $S_{312}$ of FIG. 3(c) is issued at the subtracting point 312, and then by sampling followed by holding by a sample-and-hold circuits 331 and 332, red and blue color signals are issued as shown by $S_{331}$ and $S_{332}$ of FIG. 3(c) from the sample-and-hold circuits 331 and 332. On the other hand, after passing the low pass filter 34 a quasiluminance signal having the component as shown by FIG. 2(b) and FIG. 2(c) alternating with the period of one horizontal scanning is given to the adding point 311. Namely, the quasiluminance signal has shortages of blue or red components alternatingly every horizontal scanning period, and therefore, the blue and red components are alternatingly added to the adding point through an electronic switch SW which alternatingly changes over synchronizing to the horizontal scanning. Thus, the quasi-luminance signal from the low pass filter 34 is compensated to form complete luminance signal Y. The encoder 35 receives the luminance signal from the adding point 311 and chrominance signal, (red and blue signals) from the sample-and-hold circuits 331 and 332 and produces known composite video signal from its output terminal.

In FIG. 3(b) of the circuit of frequency separation type, the output signal from the solid state photoelectric device 11 is led through a low pass filter 34 of cut off frequency of 3.58 MHz to an adding point 311, and also led through a band pass filter 36 to a first detector 37. Also the output signal of the band pass filter 36 is led through a delay circuit 38 which delays for a time period of one horizontal scanning to a second detector 39. When the scanning is on the odd number line 21, 23 . . ., the outputs of the band pass filter 36, and hence that of the detector 37 is a blue signal as shown by left part of $S_{37}$ of FIG. 3(d), and the quasi-luminance signal from the low pass filter 34 has small blue component as shown by left part of $S_{34}$ of FIG. 3(d). Then by adding of blue component signal $S_{37}$ from the detector 37, the composed luminance signal is finished as shown by left part of $S_{311}$ of FIG. 3(d). When the scanning is on the even number lines 22, 24 . . ., the output of the detector 37 becomes red signal as shown by right part of $S_{37}$ of FIG. 3(d), and the quasi-luminance signal from the low pass filter 34 has small red component as shown by right part of $S_{34}$ of FIG. 3(d). Then by adding of red component signal $S_{37}$ from the detector 37, the complete luminance signal is finished as shown by right part of $S_{311}$ of FIG. 3(d). The detectors 37 and 39 alternatively issues blue and red signals for every one scanning period, and therefore, the output of the detectors 37 and 39 are given through a changeover switches SW' with horizontal scanning to the encoder 35 as red and blue color signals of chrominance signal.

Figure 4A:
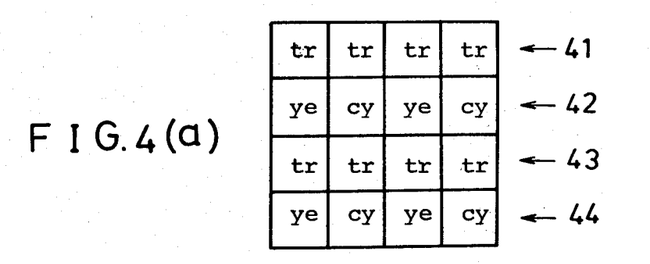
FIG. 4(a) is a schematic front view of a small part of another example of filter of a solid state color imaging apparatus in accordance with the present invention.
Figure 4B:
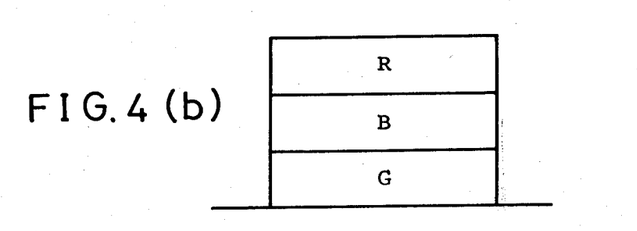
FIG. 4(b) and FIG. 4(c) are charts schematically showing intensity of primary color components of light obtained by the filter of FIG. 4(a).
Figure 4C:
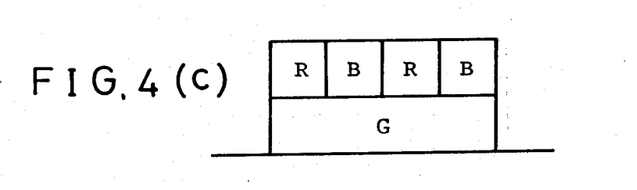

FIG. 4(a) shows a second example of a filter element arrangement, wherein the odd number lines 41, 43, the filter elements are all transparent and in even number lines 42, 44, the filter elements are alternating disposition of the first complementary color and the second complementary color, that is alternating disposition of yellow and cyanic. FIG. 4(b) and FIG. 4(c) respectively show positional distribution of component primary colors of light contained in the incident light on the photoelectric elements passing through the transparent lines 41, 43, . . . and those through the yellow & cyanic alternating lines 42, 44, . . . . As shown by FIGS. 4(b) and 4(c), the incident light to the photoelectric device 11 contains at least two primary colors, and hence is more efficient than the prior art case where every position receives only one primary color.

Figure 5:
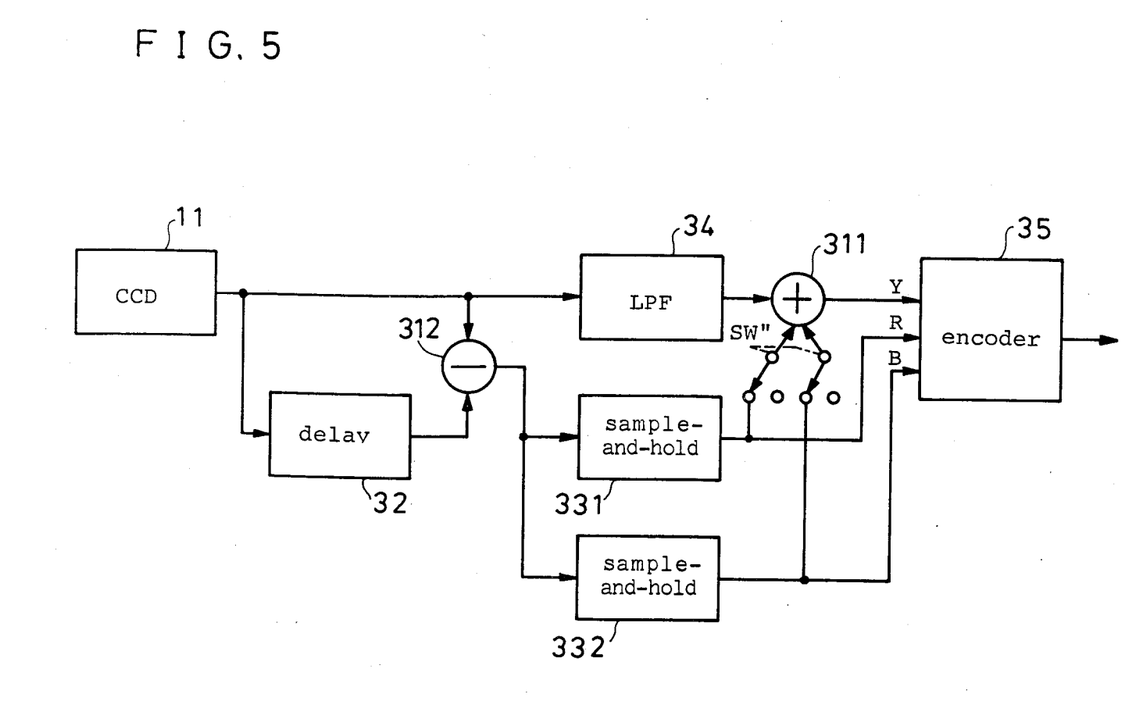
FIG. 5 is a block diagram of an example of a signal processing circuit for processing signal issued from the photoelectric device of FIG. 4(a).

FIG. 5 is a block diagram of one example of an electric circuit to process the output signal of the photoelectric device 11 provided with the filter of FIG. 4. The circuit is analogous to that of FIG. 3(a), but the interlinked switch SW" is inserted between the output terminals of the sample-and-hold circuits 331 and 332 and the adding point 311. By subtracting the signal from the delay circuit 32 from the output signal of the photoelectric device 11 at the subtracting point 312, a signal of red and blue alternation is obtained. This signal is given to the sample-and-hold circuits 331 and 332, whereby red and blue output signals are issued from the sample-and-hold circuits 331 and 332, respectively. On the other hand, when scanning is on the ye-cy lines 42, 44, . . . , the low pass filter 34 issues green signal and alternating R and B signal, while when scanning is on the transparent lines 41, 43 . . . , the low pass filter 34 issues a signal having all of red, blue and green signal components. Therefore, by closing the interlinked switch SW" only when the scanning is on the ye-cy lines 42, 44 . . . , thereby adding the red and blue signals to the quasi-luminance signal, the adding point 311 issues a complete luminance signal having all of red, blue and green signal components. That is, the interlinked switch is closed on every other horizontal scanning period at every two of the same period. Thus the encoder 35 receives luminance signal Y from the adding point 311 and red and blue signals from the sample-and-hold circuits 331 and 332, and produces a composite video signal.

As has been elucidated, according to the present invention, different from the prior art apparatus, green light passes through the filter on all the area thereof, and therefore, light utility efficiency is superior, leading to high sensitivity and high resolution and simple color signal separation circuit for single chip color imaging apparatus. Furthermore, since the filter elements are only of yellow, cyanic and transparent, compensation of line crawling is easy.

Figure 6:
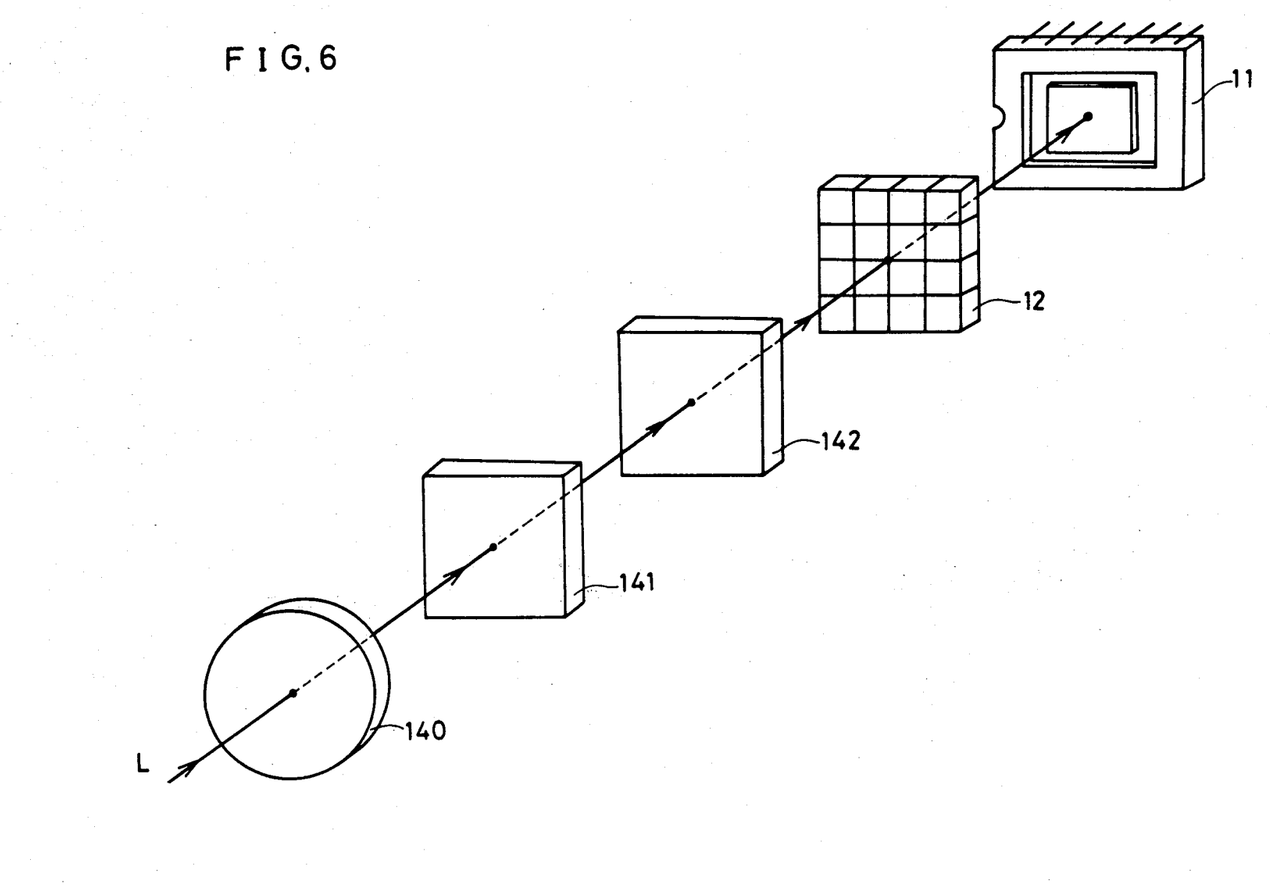
FIG. 6 is an exploded perspective view of an actual example apparatus in accordance with the present invention.
Figure 7:
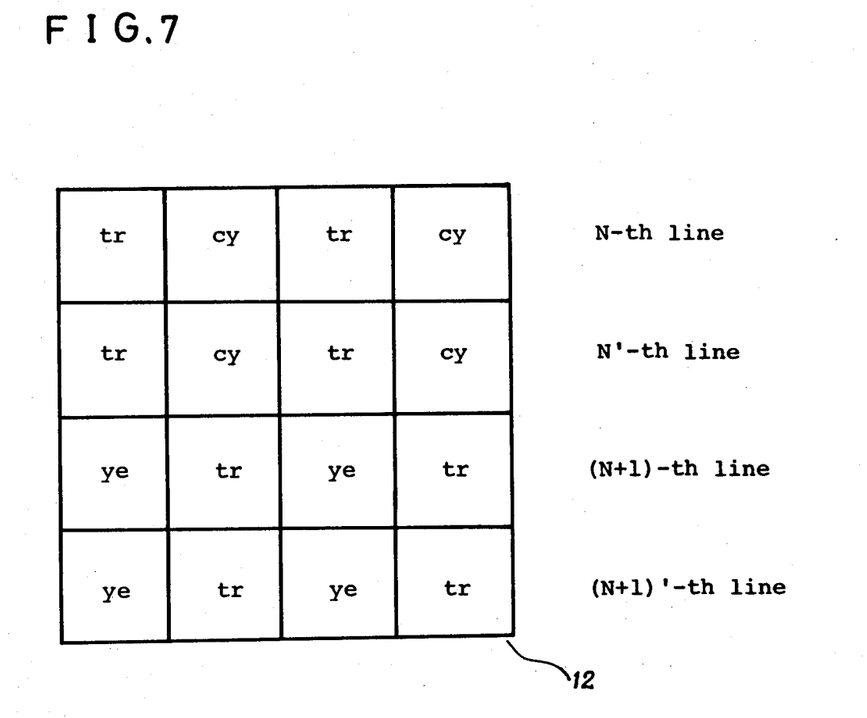
FIG. 7 is a schematic front view of a small part of the filter 12 of FIG. 6.
Figure 8:
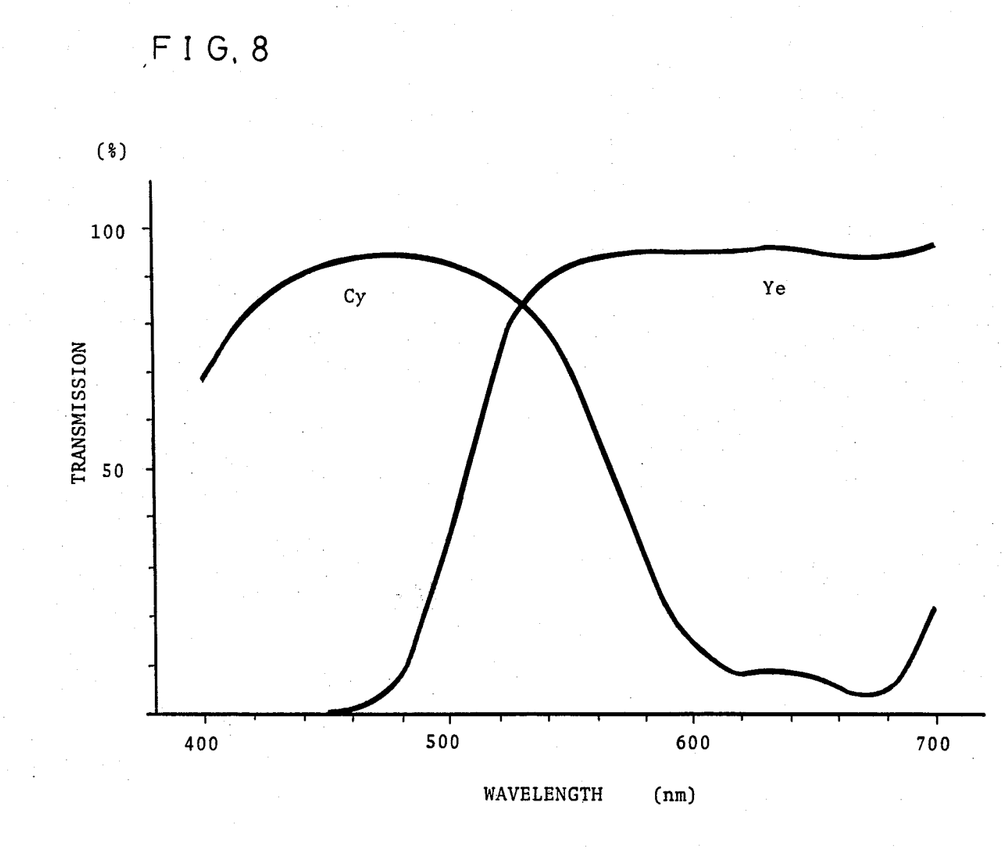
FIG. 8 is a graph showing light transmission characteristics of color filter elements.
Figure 9:
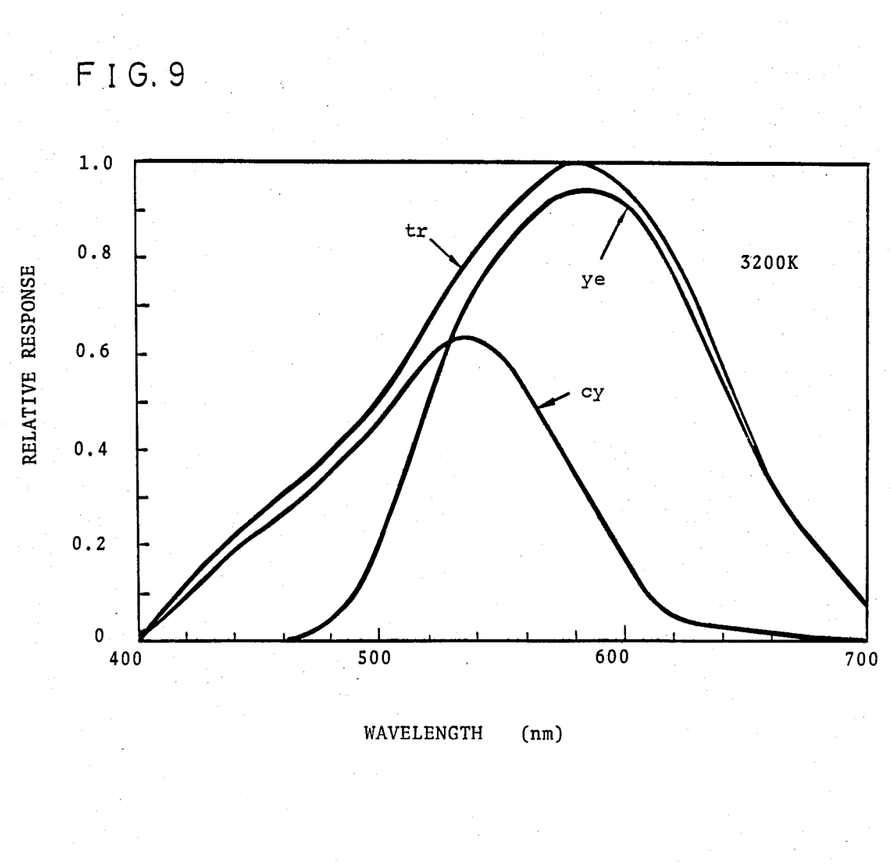
FIG. 9 is a graph showing overall relative responses for the yellow filter parts, cyanic filter parts and transparent filter parts.

FIG. 6 is an exploded perspective view showing structure of an actual example for use in ordinary TV system. A light L from object passes through a lens 140, a crystal filter 141, infrared light cut-off filter 142 and the filter 12 in accordance with the present invention, and is focused on the photoelectric device 11 which is constituted by a CCD device. In practical structure, the filter 12 is bonded on a interline type CCD device 11, which has 383 picture elements in each horizontal line and has 512 rows in vertical direction, that is, 383×512 picture elements. The filter 12 has the structure, as shown by its one small part in FIG. 7. In FIG. 7, N-th line and (N+1)-th line are for A-field and N'-th line and (N+1)'-th line are for B-field, respectively of the interlace scanning. In the filter face, the parts denoted as tr are transparent, the elements denoted as cy are cyanic colored and the elements denoted as ye are yellow colored. That is to say, this filter has two kinds of lines, namely tr-cy lines and tr-ye lines, every two rows in the vertical direction the two kinds of lines are alternatingly repeated. Spectral transmission characteristics of the yellow elements (ye) and cyanic elements (cy) of the complementary color filter system are shown in FIG. 8, whereby the curves show broad spectral ranges of light transmissions of these complementary color filter elements, which lead to better light utility efficiency of the complementary color filters than primary color filters. FIG. 9 shows over-all spectral characteristics of the system including the infrared cut-off filter 142, the three parts of the color filter 12 and the CCD device 11 of an example. A curve tr shows the characteristic of the transparent parts, a curve ye that of yellow filtered parts and a curve cy that of cyanic filtered parts.

Figure 10:
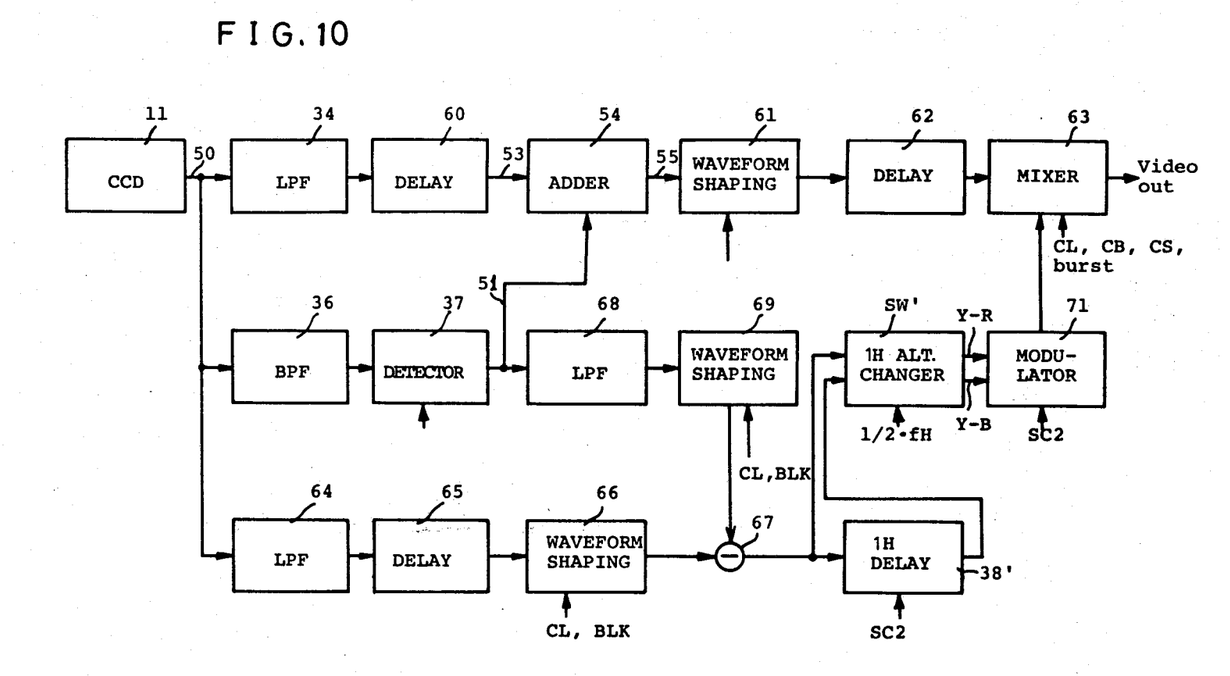
FIG. 10 is a block diagram of a color signal processing circuit in the apparatus of FIG. 6.
Figure 11:
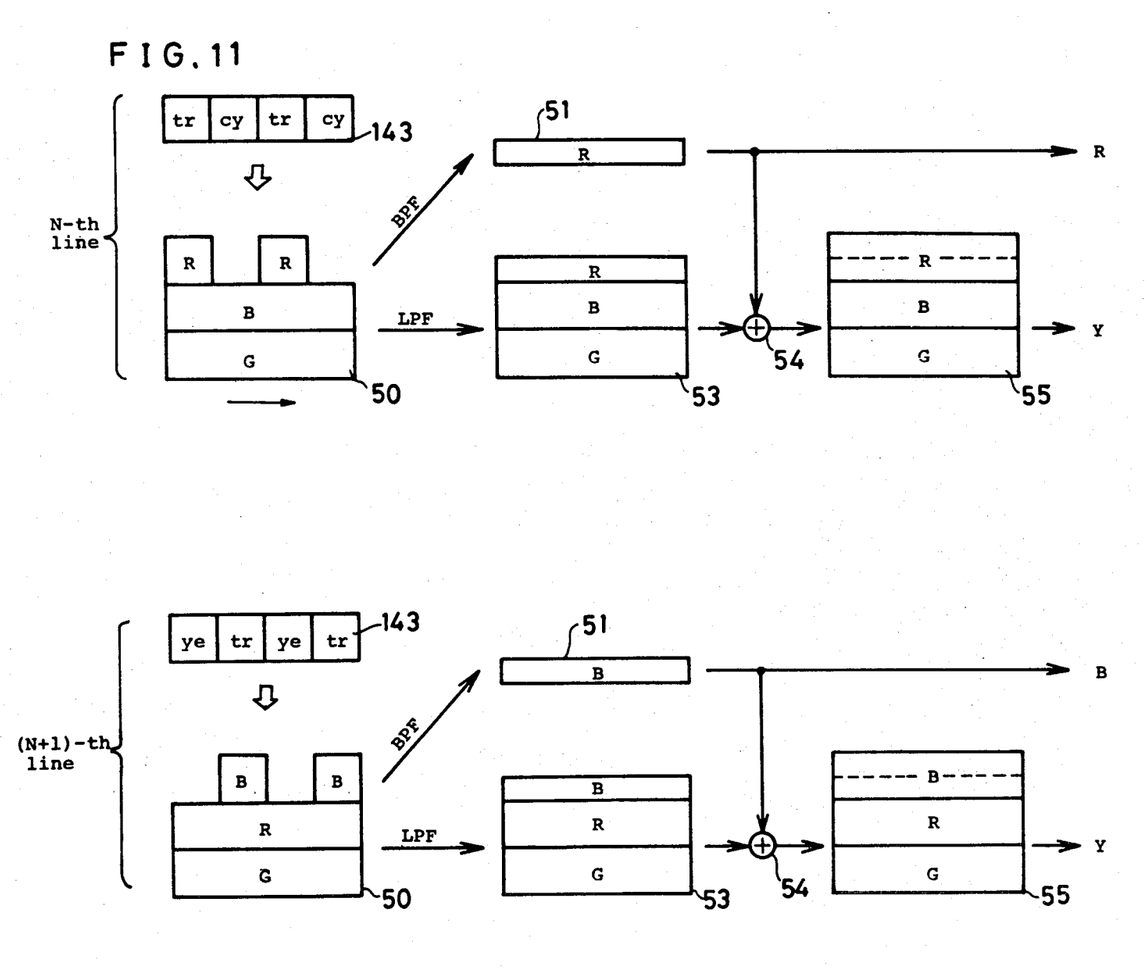
FIG. 11 is a chart schematically showing signal processing in the circuit of FIG. 10.

FIG. 11 shows principle of color signal separation in case of the example using the color filter 12 of FIG. 7, and FIG. 10 is a block diagram of one example of the signal processing circuit. When the output signal 50 of the CCD device 11 passes through the band pass filter 36 followed by detection in the detector 37, red or blue output signal 51 of FIG. 11 is produced at the output of the detector 37. On the other hand, when the output 50 of the CCD device 11 passes through the low pass filter 34, a quasi-luminance signal 53 of $$\left[ G + B + \frac{R}{2} \right] \text{ or } \left[ G + R + \frac{B}{2} \right]$$

is produced and given to the adder 54, to which the red or blue signal 51 from the detector 37 is added thereby to produce complete luminance signal 55 of G+B+R or G+R+B. Thus, irrespective of the number of scanning line of N-th or (N+1)-th, the color signal component becomes equal, and therefore line crawling is eliminated.

According to the present invention, by means of adoption of the complementary color filters and transparent parts, the red and blue signals are obtainable only by passing the CCD-output through the band pass filter 36, and these color signal as such can be utilized for compensation of the line crawling. Therefore, the compensation of line crawling is very easy. The band pass filter 36 has the center frequency of 3.58 MHz and band width of 1 MHz. The output 51 of the detector 37 has red signal and blue signal alternating every horizontal scanning period. Therefore, utilizing resemblance of adjacent line signals, the color signal can be used as the color signal for the next line by delaying by one horizontal scanning period. The quasi-luminance signal is produced after passing the CCD output 50 to the low pass filter 34 of the cut off frequency of 3.58 MHz and, the line crawling of the quasi-luminance signal is compensated by adding the necessary color signal at the adder 54 thereby finishing a complete luminance signal. The output of the low pass filter 34 passes through the delay circuit 60, the adder (as line crawl compensation circuit) 54, a waveform shaping circuit 61 and another delay circuit 62 and comes to a mixer 63. On the other hand, the CCD output 50 passes another low pass filter 64, another delay circuit 65, another waveform shaping circuit 66 and is given to a subtraction circuit, chrominance signal circuit 67. Further, the CCD output 50 passes through the band pass filter 36, the detector 37 and is given to the adder 54 to compensate line crawling. On the other hand, the output of the detector 37 passes through a low pass filter 68, and a waveform shaping circuit 69, and is given to the subtraction circuit 67. Then, the output of the subtraction circuit 67 forms a first chrominance signal, and the signal from the same chrominance signal circuit but taken out through a delay circuit 38' of one horizontal scanning period delay can be used as a second chrominance signal. Both the first and the second chrominance signals, namely, the output of the circuit 67 and the delay circuit 38' are alternatingly switched by an electronic switch SW' and the resultant output chrominance signals R-Y and B-Y are given to a balanced modulator 71, which modulates the chrominance signals with the carrier frequency of 3.58 MHz. The output of the modulator 71 is then given to the mixer 63 to produce a composite video signal by additions of clamp pulse, composite blanking pulse, composite synchronizing pulse and burst signal.

The solid-state color imaging apparatus in accordance with the present invention has an S/N ratio higher by about 9 dB than that of the conventional apparatus using color filter consisting of primary color filter elements and the same CCD device under the same luminance. This experimental data well agrees with the experimental result that the filter 12 comprising the complementary color elements and transparent parts has about 9 dB higher light transmission than that of the conventional color filter consisting of primary color elements. That is, according to the present invention, a higher efficiency of light utility is attainable. Especially, the present invention can attain a higher resolution in oblique directions than in the cases of the prior arts. This is considered based on the fact that by use of the filter in accordance with the present invention, all the picture elements receive light including green light component.

Figure 12:
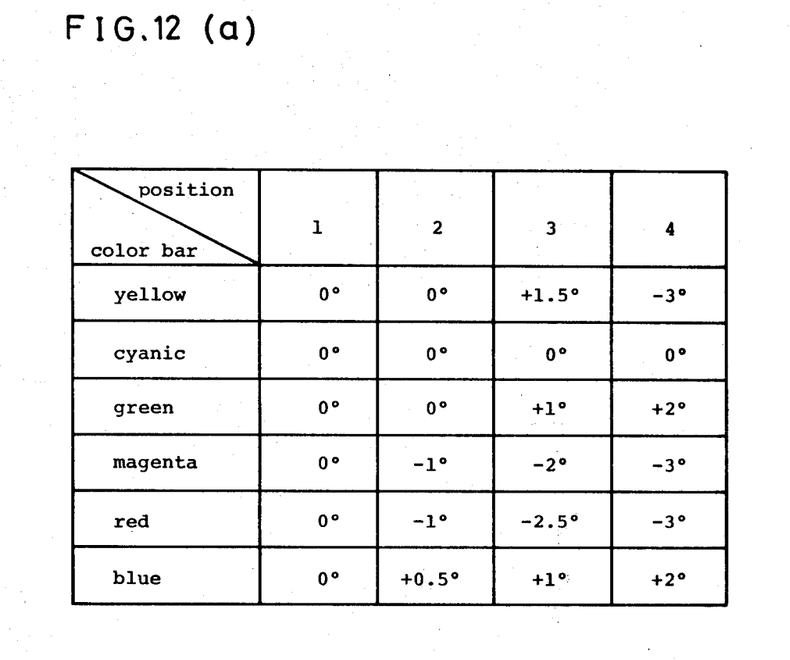
FIG 12 is a chart showing experimental result of color hue changes depending on the horizontal positions on the photoelectric device 11.

FIG. 12(a) shows color hue change depending on horizontal positions on the photoelectric CCD device. If charge transmission in the CCD becomes worse, a signal of a picture element is mixed to the signal of the next picture element, and hence the undesirable mixing of color or decrease of color purity is induced. Such color mixing becomes larger as the number of stage of signal transmission is larger. That is, in a horizontal output signal, such insufficient charge transmission will induce gradual change of hue to the side which is at an end of the scanning in a line. In the chart the "position" 1, 2, 3 and 4 are on the positions of a sliding color bar shown in FIG. 12(b), which schematically shows arrangement of the measurement, wherein WL designates white light, 100 the horizontally sliding color bar which slides from the position 1 to the position 4 wherein colors in the leftmost column of FIG. 12(a) is selectively used in measuring, 101 a camera comprising the CCD device 11 with the color filter 12 of FIG. 7, 102 a vectorscope for measuring color hue change responding to movement of the color bar 100. Measurement of hue change with respect to the vertical position is also carried out, but there is no noticeable change. As shown in FIG. 12(a) the change of hue is within 3° for any tested colors, and therefore the apparatus has a satisfactory characteristics in practical use.

What is claimed is:

1. A solid state color imaging apparatus comprising
   a solid state photoelectric device having an array of picture elements and output signals,
   a color filter fixed in front of said solid state photoelectric device, and having filter elements of a first complementary color, and filter elements of a second complementary color and substantially transparent parts,
   a separation circuit for analyzing said output signals of said solid state photoelectric device into a quasi-luminance signal and a color signal,
   a composing circuit for adding said color signal to said quasi-luminance signal thereby to furnish a luminance signal without line crawling.

2. A solid state color imaging apparatus in accordance with claim 1, wherein both luminance information and color information are sequentially issued from said solid state photoelectric device.

3. A solid state color imaging apparatus in accordance with claim 1, wherein said first complementary color is cyanic and said second complementary color is yellow.

4. A solid state color imaging apparatus in accordance with claim 1, wherein said color filter has
   first lines comprising said first complementary color elements and transparent elements in alternating disposition in the line, and
   second lines comprising said second complementary color elements and transparent elements in alternating disposition in the line,
   said first lines and said second lines being disposed in a repeating pattern.

5. A solid state color imaging apparatus in accordance with claim 4, wherein said separation circuit comprises a low pass filter which issues said quasi-luminance signal, a band pass filter and a delay circuit which delays the output signal of said band pass filter for a time period of one horizontal line scanning.

6. A solid state color imaging apparatus in accordance with claim 1, wherein said separation circuit comprises detector circuits, the output of which is to be given to said composing circuit.

7. A solid state color imaging appratus in accordance with claim 1, wherein the adding is always carried out continuously.

8. A solid state color imaging apparatus in accordance with claim 1, wherein said adding is carried out on every other horizontal line scanning period.

9. A solid state color imaging apparatus in accordance with claim 1, wherein said color filter has
   first lines comprising said transparent elements and
   second lines comprising said first complementary color elements and said second complementary color elements in alternating disposition,
   said first lines and second lines being disposed in a repeating pattern.

10. A solid state color imaging apparatus in accordance with claim 4, wherein said first lines and said second lines are disposed in a manner that transparent parts lie under the complementary color parts.

11. In a solid state color imaging apparatus comprising a solid state photoelectric device having an array of picture elements, a color filter fixed in front of said solid state photoelectric device, the improvement that said color filter has filter elements of a first complementary color, and filter elements of a second complementary color and substantially transparent parts, said color filter having first lines comprising said transparent elements and second lines comprising said first complementary color elements and said second complementary color elements in alternating disposition, said first lines and second lines being disposed in a repeating pattern.

* * * * *